(12) United States Patent
Jin et al.

(10) Patent No.: US 10,359,469 B2
(45) Date of Patent: Jul. 23, 2019

(54) NON-INTRUSIVE ON-CHIP ANALOG TEST/TRIM/CALIBRATE SUBSYSTEM

(71) Applicant: NXP USA, Inc., Austin, TX (US)

(72) Inventors: Xiankun Jin, Austin, TX (US); Douglas A. Garrity, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/839,174

(22) Filed: Dec. 12, 2017

(65) Prior Publication Data

US 2019/0178938 A1 Jun. 13, 2019

(51) Int. Cl.
| | | |
|---|---|---|
| *G06F 11/27* | (2006.01) | |
| *G01R 31/317* | (2006.01) | |
| *G01R 31/3177* | (2006.01) | |
| *G01R 31/3187* | (2006.01) | |

(52) U.S. Cl.
CPC ... *G01R 31/31724* (2013.01); *G01R 31/3177* (2013.01); *G01R 31/31703* (2013.01)

(58) Field of Classification Search
CPC ..... G06F 11/27; G06F 11/25; G01R 31/3177; G01R 31/3187; G01R 31/3167; G01R 31/31724
See application file for complete search history.

(56) References Cited

U.S. PATENT DOCUMENTS

| | | | |
|---|---|---|---|
| 6,728,916 B2 | 4/2004 | Chen et al. | |
| 7,129,734 B2* | 10/2006 | Geiger | G01R 31/3167 324/750.3 |
| 7,222,261 B2* | 5/2007 | Song | G01R 31/3167 714/30 |
| 7,249,302 B2* | 7/2007 | Maltseff | G01R 31/2884 714/703 |
| 7,436,222 B2 | 10/2008 | Shyr et al. | |
| 8,310,265 B2* | 11/2012 | Zjajo | G01R 31/31855 324/750.3 |
| 9,547,043 B2* | 1/2017 | Ahmed | G01R 31/31854 |
| 2011/0218755 A1* | 9/2011 | Dhayni | G01R 31/31716 702/117 |

OTHER PUBLICATIONS

R. De Vries et al., Built-In Self-Test Methodology for A/D Converters, European Design and Test Conference, Mar. 17-20, 1997, https://ris.utwente.nl/ws/portalfiles/portal/5532143.
Andrew Turner et al., Freescale Semiconductor, Inc., Using the Built-in Self-Test (BIST) on the MPC5777M, Document No. AN5131, Rev. 0, Oct. 2015.
Xiankun Jin et al., U.S. Appl. No. 15/652,309, filed Jul. 18, 2017, titled Built-In Self Test for A/D Converter.

\* cited by examiner

*Primary Examiner* — Phung M Chung

(57) ABSTRACT

An on-chip built-in self-test (BIST) circuit (10) uses a controller (16), analog-to-digital converter (ADC) (15), and digital-to-analog converter (DAC) (12) to sense voltage and/or temperature measures at predetermined circuit locations (19), to detect one or more idle states for an analog block during normal operation, to initiate a built-in self-test of the analog block during the idle state(s) by sending input test signals over a first bus (13) to the analog block, and to process analog test signals received over a second bus (14) from the analog block to generate digital built-in self-test results for the analog block so that the performance analyzer can analyze the digital built-in self-test results in combination with any voltage and/or temperature measurements to evaluate selected performance measures for the analog block against one or more performance criteria.

20 Claims, 5 Drawing Sheets

NON-INTRUSIVE ON-CHIP ANALOG TEST/TRIM/CALIBRATE SUBSYSTEM

BACKGROUND OF THE INVENTION

Field of the Invention

The present invention is directed in general to field of integrated circuit testing. In one aspect, the present invention relates to a built-in self-test method, apparatus and system for testing analog and mixed signal circuits.

Description of the Related Art

With system-on-chip (SoC) circuits that incorporate digital and analog or mixed signal blocks, it is important to test the circuit performance at manufacture and also during normal operation. While digital and analog circuit tests can be performed at manufacture, such tests can only capture performance or design defects before field deployment, and may not detect latent defects or performance-related problems that arise during the field operation of the product (e.g., aging effects), thereby posing functional safety concerns. Built-in self-test (BIST) or built-in test (BIT) circuits are often included to provide a mechanism for the SoC circuit to test itself to meet performance requirements (e.g., high reliability or lower repair cycle times) or constraints (e.g., limited technician accessibility or test costs during manufacture) by decreasing the cost of relying on external (pattern-programmed) test equipment. There are special challenges with performing field testing of analog and mixed signal blocks due to the poor external visibility of such SoC blocks, as well as the requirement for circuit trimming and calibration to compensate for process, voltage, temperature (PVT) variation during analog testing. In addition, conventional analog testing solutions require expensive mixed-signal test instrument and/or specialized knowledge and skill of analog test engineers. As seen from the foregoing, the existing analog test solutions are extremely difficult at a practical level by virtue of the difficulty in accurately and efficiently capturing analog block inputs and/or outputs during normal operation, especially when operating conditions over the life the SoC circuits can introduce aging effects and other static and dynamic performance changes that require lifetime testing, trim, and/or calibration changes that are costly and complex.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

An apparatus, system, and methodology are described for testing analog and mixed signal blocks with an on-chip built-in self-test (BIST) subsystem in which a digital-to-analog converter (DAC) and analog-to-digital converter (ADC) are connected over force and sense bus lines to one or more analog blocks to enable a BIST controller and analyzer to non-intrusively test, calibrate, and/or trim the analog block(s) on demand while being non-intrusive to normal system operation. In selected example embodiments, BIST testing and/or calibration is applied to first ensure the static and dynamic performance of the ADC and DAC by conscripting processing cycles during one or more idle states when the ADC and DAC conversion is not needed. Upon determining that the ADC and DAC meet the required test requirements or are otherwise properly calibrated, one or more analog or mixed signal blocks may be tested, trimmed, and/or calibrated by connecting the BIST controller to send analog test input signals over the DAC and force bus to an analog/mixed signal block under test, and to receive analog test result signals sent back over the sense bus and ADC for analysis by the BIST analyzer. In selected embodiments, BIST control and analysis circuitry can monitor idle states of the DAC, ADC, and/or analog/mixed signal block(s) under test (e.g., the time during which an application of the system is not using these circuits) and initiate a BIST test upon determining that the BIST test can be performed during an encountered idle state. Alternatively, the BIST control and analysis circuitry can save test state information accumulated over test operations performed over multiple idle states to allow for interrupts when an application needs use of the DAC, ADC, and/or analog/mixed signal block(s) under test.

Figure 1:
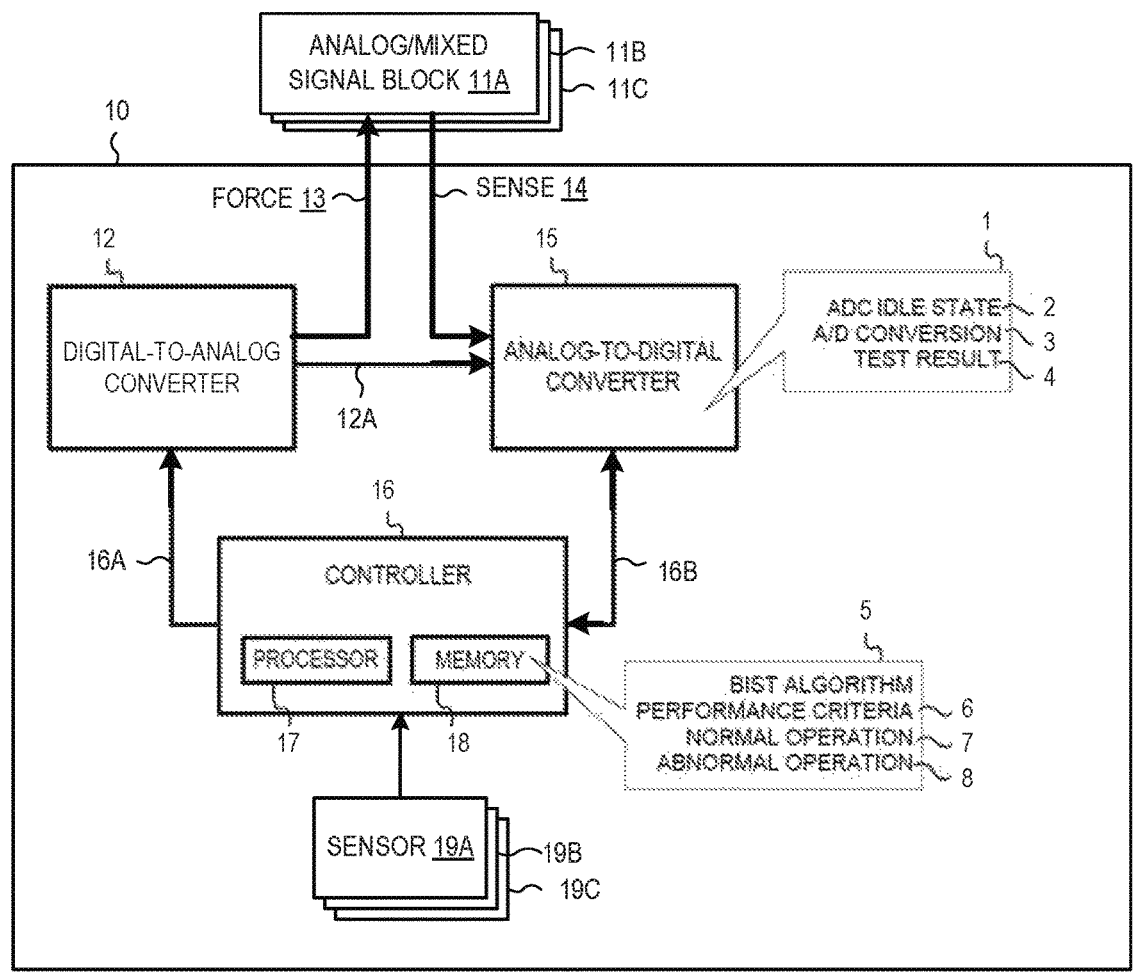
FIG. 1 depicts a simplified illustration of an on-chip built-in self-test subsystem for testing, trimming, or calibrating an analog/mixed signal block in accordance with selected embodiments of the present disclosure.

To provide additional details for an improved understanding of selected embodiments of the present disclosure, reference is now made to FIG. 1 which depicts a simplified illustration of an on-chip built-in self-test (BIST) subsystem 10 for testing, trimming, or calibrating one or more analog/mixed signal blocks 11 in accordance with selected embodiments of the present disclosure. Any of a variety of different analog or mixed signal block may be tested with the disclosed BIST subsystem 10, including but not limited to a power management control block 11A, a voltage regulator 11B, an oscillator, clock or phase lock loop circuit 11C, or other analog blocks, such as a bandgap voltage reference generator, analog-to-digital converter, digital-to-analog converter, or the like. As depicted, the BIST subsystem 10 may be formed as a portion of an integrated circuit that includes a digital-to-analog converter 12, an analog-to-digital converter 15, one or more sensors 19A-C, and associated BIST test controller circuitry 16 for implementing one or more features for testing one or more analog or mixed signal blocks 11A-C. In selected embodiments, each of the DAC 12 and ADC 15 may be controlled and monitored to define operative conditions 1 which include idle states 2, conversion states 3, and test states 4 so as to allow non-intrusive performance of self-test and calibration operations. In addition, the DAC 12 and ADC 15 may be embodied with the BIST subsystem 10 and sensor(s) 19 as an integrated circuit in a system on chip (or "SOC") architecture that additionally integrates the analog or mixed signal blocks 11A-C with additional SOC elements, such as a data processor, a memory, and the like, on a common semiconductor substrate, package substrate, and the like. Thus, the controller 16 may include a processor 17 and memory 18 to implement a BIST algorithm 5 as a non-programmable state machine or an instruction-based processor and associated memory for storing the BIST algorithm performance criteria 6 that may be used to infer normal operation 7 or abnormal operation 8, though the operations of the described test algorithm could also be implemented in hardware with non-programmable state machine logic. In selected software embodiments, the BIST algorithm 5 controls the processor 17 to perform operations, such as predicting or determining an idle state 2 of the analog-to-digital converter 15 which represents a time during which an analog-to-digital conversion is not being performed by the analog-to-digital converter 15 for an associated application. For example, the idle state can be the result of the analog-to-digital converter having no active or pending conversions, the result of an ongoing conversion having been paused, and the like. In similar fashion, the BIST algorithm 5 may control the processor 17 to predict or determine DAC idle states and conversion states for the DAC 12.

When the controller 16 determines that conversion operations at the DAC 12 and ADC 15 are not needed (e.g., when both the DAC 12 and ADC 15 are in an idle state), the controller 16 can initiate or commence the BIST algorithm 5 to test the DAC 12 and/or ADC 15 as a preliminary step in testing the analog/mixed signal blocks 11. For example, during an ADC idle state 2, the controller 16 may send one or more commands 16A to the DAC 12 to provide test information 12A to the analog-to-digital converter 15, and may also send one or more commands 16B to the ADC 15 to convert the test information 12A and provide the result to the controller 16 for analysis. Thus, the test algorithm 5 causes the controller 16 to start the DAC 12 to send the analog test signal, and sends synchronized information to instruct the ADC 15 to perform the self-test and digitally capture the ADC test results 4 during the ADC idle state 2 based upon the analog test information 12A provided by the DAC 12. The controller 16 may then compare the digital ADC test results 4 to one or more performance criteria 6 (range of values, threshold limits, or other logical statements). If the digital ADC test results 4 satisfy the performance criteria 6, then the controller 16 can infer a normal operation 7. However, if the digital ADC test results 4 fail to satisfy the performance criteria 6, then the controller 16 can infer an abnormal operation 8, perhaps indicating a fault or error. Upon successfully testing the ADC 15 (or making any required calibration adjustments to the ADC 15), the controller 16 can use a similar testing sequence to test the DAC 12 during one or more DAC idle states by sending test information commands 16A to the DAC 12 along with synchronized commands 16B instructing the ADC 15 to capture and convert the analog test result output 12A into digital format for evaluation by the BIST algorithm 5 against performance criteria 6. Of course, the test sequence can be altered, such as by performing the DAC test first, or performing the ADC and DAC tests simultaneously. In whatever test sequence is used, the DAC 12 and ADC 15 may use the BIST algorithm 5 to ensure required performance parameters for the ADC 15, such as static specifications (e.g., offset, full-scale, gain, Differential Non-linearity (DNL), Integral Non-linearity (INL)) and dynamic specifications (e.g., Signal to Noise Ratio (SNR), Spurious Free Dynamic Range (SFDR), Total Harmonic Distortion (THD), Signal to Noise And Distortion (SINAD), Effective Number Of Bits (ENOB)).

Once the DAC 12 and ADC 15 are successfully tested and any required calibration adjustments are made, the same approach may be used with other analog or mixed signal blocks 11 on the SoC by using a pair of force and sense busses 13, 14 to extend the BIST test functionality to each analog/mixed signal block 11A-C. For example, the controller 16 may implement a BIST algorithm 5 to test a first analog/mixed signal block 11a by first determining that there is an idle state at the first analog/mixed signal block 11a, DAC 12 and ADC 15, though in other embodiments, the DAC 12 and ADC 15 may not both need to be idle for testing of the analog/mixed signal block 11a. Once the required idles states are detected, the controller 16 then initiates the BIST algorithm 5 to test the first analog/mixed signal block 11a by sending one or more commands 16A to the DAC 12 to generate analog test information. However, instead of routing the analog test information directly to the ADC 15, the controller 16 routes the analog test information over the force bus 13 to the first analog/mixed signal block 11a, and then routes the resulting output analog information over the sense bus 14 back to the ADC 15. In addition, controller 16 sends one or more commands 16B to the ADC 15 to convert the resulting output analog information into digital form and provide the digital test results to the controller 16 for analysis and comparison against the performance criteria 6 to detect whether the first analog/mixed signal block 11a is operating normally or not.

Exemplary embodiments thus present an elegant solution for testing analog and mixed signal IP blocks which are increasingly used as important components of many applications implemented by electrical systems and integrated circuits (IC). Indeed, as one example, the recent push to autonomous driving puts extremely stringent safety requirements on in-car electronics associated with such applications which often include one or more analog or mixed signal circuit blocks. Since traditional manufacturing testing ensures only the functionality and/or accuracy of the analog circuits before deployment in the field, the on-chip built-in self-test (BIST) subsystem 10 disclosed herein enables in-field testing, trimming, or calibrating analog/mixed signal blocks that will be especially valuable for safety critical applications, including autonomous driving, by providing immediate, in-field, real world testing to ensure safe, efficient, and desired performance.

To the extent that an analog or mixed signal block being tested is likely an important operation that should not be interrupted, exemplary embodiments of the present disclosure selectively apply the built-in self-testing operations so as to not disrupt normal application execution by separating the in-field test operations in time from the normal operation of the analog/mixed signal block under test. Exemplary embodiments may thus blend implementation of the built-in self-test 5 with normal operation of the analog/mixed signal block 11a using time sharing techniques, without disruption of an application's normal operation. That is, exemplary embodiments implement the on-chip built-in self-test 5 with cycle sharing according to various states. Thus, in-field testing of static/dynamic linearity performance, basic functionality, and the like, of the analog/mixed signal block 11a becomes possible during idles states. Exemplary embodiments are thus applicable to any built-in self-test, as any architecture and test methodology is applicable.

Figure 2:
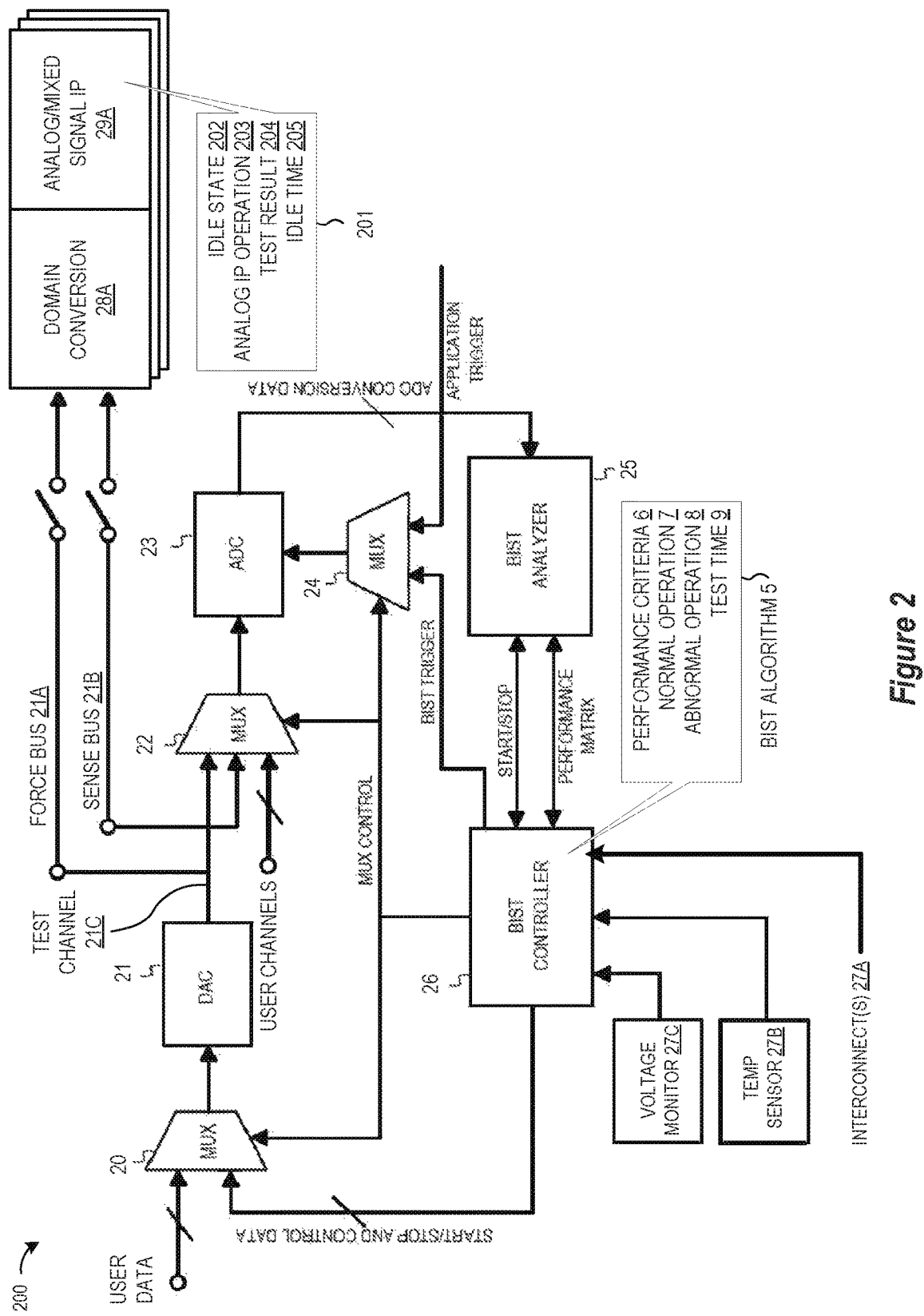
FIG. 2 depicts additional circuit details of an on-chip built-in self-test subsystem for testing, trimming, or calibrating an analog/mixed signal block in accordance with selected embodiments of the present disclosure.

To provide additional details for an improved understanding of selected embodiments of the present disclosure, reference is now made to FIG. 2 which is a simplified circuit schematic diagram of an on-chip built-in self-test subsystem 200 for testing, trimming, or calibrating an analog/mixed signal block in accordance with selected embodiments of the present disclosure. As depicted, the BIST subsystem 200 includes a BIST analyzer 25 and BIST controller 26 that are connected to receive interconnect indicators 27A along with inputs from a temperature sensor 27B and voltage sensor 27C for purposes of controlling and analyzing analog test, trim and calibration operations at one or more analog or mixed signal blocks 29, such as a bandgap voltage reference generator 29A which generates a fixed voltage that is independent of variations in the power supply, temperature, and circuit loading. In an example application, the inputs from a temperature sensor 27B and voltage sensor 27C can be used to test the accuracy of a voltage reference in an analog/mixed-signal system (e.g., an ADC) which sets the level of achievable performance and must be known in order to correctly evaluate or test the performance of the overall analog/mixed-signal system. In applications where the value of a bandgap voltage reference that is supposed to be stable with temperature, the temperature sensor 27B may be used by the BIST controller 26 to detect temperature changes so that the BIST analyzer 25 can calculate what the corresponding voltage reference output should be. In addition, the BIST controller 26 can use the voltage sensor 27C to measure the actual voltage reference output to see whether or not it is within the specified tolerance. If not, the BIST controller 26 and BIST analyzer 25 could trim or adjust the voltage reference until it is within the specified tolerance.

In selected embodiments, the BIST controller 26 may use an a digital-to-analog converter (DAC) 21 to send analog test signals over a force bus 21A to the analog/mixed signal block 29 under test, and may then use the analog-to-digital converter (ADC) 23 to receive analog test results from the analog/mixed signal block 29 under test which are returned over the sense bus 21B for feedback to the BIST analyzer 25. Depending on the type of analog/mixed signal block 29A being tested, a domain conversion circuit 28A may be required to transform the analog test signals and analog test results between the domains of the BIST subsystem 200 and analog/mixed signal block 29A. For example, the domain conversion circuit 28A may transform electrical properties between voltage, current, resistance, capacitance, and/or charge domains.

Configured as a non-programmable state machine or an instruction-based processor and associated memory, the BIST controller 26 predicts, infers, or determines when idle states exist at the DAC 21, ADC 23, and the analog/mixed signal block(s) 29 to determine when they are at least temporarily not needed or being used in normal operation. In selected embodiments, the controller 26 can have a priori knowledge of states of the system that indicates the presence of a current or up-coming idle state. For example, a signal generated by the application to place the DAC 21, ADC 23, and analog/mixed signal block 29 in a low power mode can be known to indicate the application will not need to use these components for at least a certain amount of time, during which BIST testing of the analog/mixed signal block 29 could be performed instead of going into a low-power mode. As another example, the DAC 21, ADC 23, and analog/mixed signal block 29 can operate in a time-multiplexed manner, wherein each component has a first portion its clock cycles dedicated to application processing and a second portion of its clock cycles considered idle states, during which the BIST testing can be performed on the DAC 21, ADC 23, and/or analog/mixed signal block 29. In this way, exemplary embodiments may perform basic functionality and performance testing (e.g., differential and integral nonlinearity error) of the DAC 21, ADC 23, and/or analog/mixed signal block 29 in the field with no disruption to its normal operation (e.g., the application based operations).

In the specific embodiment illustrated in FIG. 2, the BIST analyzer 25 and BIST analyzer 26 are connected to the DAC 21 and ADC 23 using input multiplexers 20, 22, 24 as shown to enable distribution of test sequences for testing the DAC 21, ADC 23, and/or analog/mixed signal block 29. In the depicted arrangement, the BIST controller 26 serves as the central controller for starting, synchronizing, pausing stopping, and the like, a built-in self-test sequence 5 for testing the DAC 21, ADC 23, and/or analog/mixed signal block 29. The controller 26 may thus monitor operational signals of each system component under test 21, 23, 29 to determine when to start, interrupt, and/or stop the operation of the system component. For example, the BIST controller 26 may be connected to receive one or more interconnect indicators 27A (e.g., "ADC power/clock OK", "System power on/off", and "ADC trigger from application") which can be monitored to determine when to implement a self-test of the DAC 21, ADC 23, and/or analog/mixed signal block 29. In addition to receiving interconnects 27A, the BIST controller 26 may be connected to receive one or more temperature sensor inputs 27B and/or voltage sensor inputs 27A which may to set different test limits for the components under test. For example, the voltage sensor input 27C may provide a voltage reference measure that is used to define a voltage corner for a BIST test applied to an analog/mixed signal block 29 that is embodied as a voltage regulator. In another example, the temperature sensor input 27B may provide a temperature measure that defines a temperature corner for understanding how to evaluate an output from an analog/mixed signal block 29 against an expected voltage range for a given temperature.

When test operation starts, the BIST controller 26 configures multiplexers 20, 22, 24 using the MUX control signal to communicate information from their respective inputs to a corresponding multiplexer output. Thus, the first multiplexer 20 is configured by the MUX control signal to communicate start/stop and control data from the BIST controller 26 (instead of the user data) to the DAC 21 when initiating the BIST test sequence. And instead of communicating analog information from the application circuitry or user channel, the second multiplexer 22 is configured by the MUX control signal to communicate analog test channel information 21C from the DAC 21. In addition, the third multiplexer 24 is configured by the MUX control signal to communicate operational triggers (BIST TRIGGER) from the BIST controller 26 (instead of the operation trigger information from the application circuitry) to the ADC 23 when performing BIST testing. In this way, BIST controller 26 can use the MUX control signals to provide digital test input signals as control data through the first multiplexer 20 to be converted by the DAC 21 into analog test input signals that are output to the test channel 21C for communication to the ADC 23 or analog/mixed signal block 29. The BIST controller 26 can also use the MUX control signals to coordinate the provision of trigger/control information through the second multiplexer 22 as a BIST trigger for the conversion process performed by the ADC 23.

By providing the START/STOP control signals to the BIST analyzer 25, the BIST controller 26 enables the BIST analyzer 25 to receive, monitor, and analyze the digital test results as ADC conversion data output from the ADC 23. As disclosed herein, the digital test results from the ADC 23 are generated directly or indirectly from the analog test input signals provided by the DAC 21 to any analog circuit component under test. For example, the DAC 21 provides the analog test input signals directly to the ADC 23 when performing BIST testing of the ADC 23 by supplying MUX control signals to the second multiplexer 22 to directly communicate the test channel 21C to the ADC 23. However, when performing BIST testing of the analog/mixed signal block 29, the DAC 21 provides the analog test input signals indirectly to the ADC 23 by first routing them over the sense bus 21A for switched connection to the analog/mixed signal block 29 under test, and then conveying the resulting analog test output signals from the device under test over the sense bus 21B to the ADC 23 by supplying MUX control signals to the second multiplexer 22 to communicate the resulting analog test output signals to the ADC 23. However provided, outputs from the ADC 23 are analyzed by the BIST analyzer 25 to generate an analysis, labeled "performance matrix", that can be provided to BIST controller 26. The performance matrix information is compared against the performance criteria 6 to determine whether the analog/mixed signal block under test is running in normal operation 7 or abnormal operation 8.

In operation, the BIST controller 26 is operable to perform BIST testing 201 of an analog/mixed signal block 29A during a detected idle state 202. For example, a current or upcoming idle state of the analog IP block 29A during normal operation is predicted or determined by the BIST controller 26 to have a duration that equals or exceeds the duration of the BIST algorithm 5 executed under control of the BIST controller 26. In other words, the BIST algorithm 5 may be completed or executed within the duration of the idle state 202. At the BIST controller 26, analog IP block 29A is known to have a plurality of idle states having various idle times, including an idle state 202 having an idle time 205. In addition, the BIST algorithm 5 is known to have a test time 9 which indicates how long the BIST test takes to execute on the analog IP block 29A. The test time 9 may be determined from a previous, historical performance of the BIST test, or an average of multiple previous runs. Should the controller 26 determine that an idle state at the analog IP block 29A is to occur, the idle time 204 of that state can be compared to the test times 9 to determine if the amount of time available is sufficient to perform a BIST test. For example, if the idle time 205 of idle state 202 is longer than test time 9, the BIST controller 26 will determine a BIST test can be performed when the idle state 202 is detected. In other embodiments, the BIST controller 26 will know, predict or infer that the analog IP block 29A will not be used or operated at a known time or event duration(s) based upon state information. In addition or in the alternative, the BIST controller 26 may use a database (not shown) which stores information identifying idle times associated with various states of operation of any analog circuit components on the integrated circuit, such as the DAC 22, ADC 23, and/or any analog or mixed signal IP block 29. Thus, the database of idle times may contain or store entries that electronically associate different states or events of analog components to different idle times. For example, the stored states may describe power on and power off events for which the event mechanism has a predetermined duration for which a corresponding analog component is idle and not needed. Whenever one of an analog component event is determined to occur, the controller 26 may query the database of idle times for the event and identify the corresponding idle time. The controller 26 may then compare the idle time (e.g., 205) to the test time (e.g., 9) required to perform the built-in self-test. If the idle time 205 equals or exceeds the test time 9, then the controller 26 may trigger or start the built-in self-test 201. The operation of the built-in self-test 201 may thus take known clock cycles and if the test time 9 fits within the duration of the event, the controller 26 may commence the on-chip built-in self-test 201.

Figure 3:
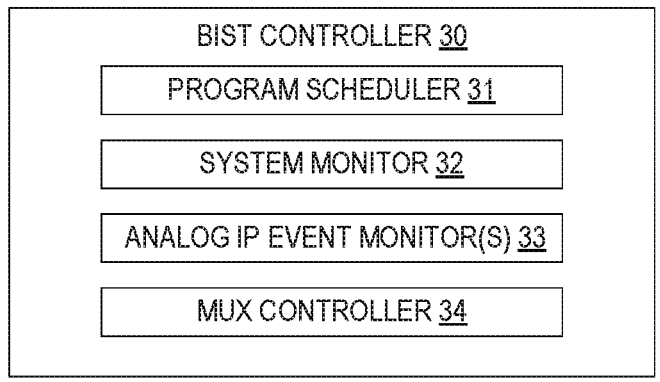
FIG. 3 depicts a simplified block diagram of a BIST controller in accordance with selected embodiments of the present disclosure.

To provide additional details for an improved understanding of selected embodiments of the present disclosure, reference is now made to FIG. 3 which depicts a simplified block diagram of a BIST controller 30 in accordance with selected embodiments of the present disclosure. The BIST controller 30 may be implemented with a processor and/or hardware as a non-programmable state machine or as a programmable instruction based processor and associated memory that executes instructions stored memory to execute the BIST testing algorithm disclosed herein. In particular, the BIST controller 30 may include a program scheduler module 31 which generates the program test sequences to be applied, and which may be embodied in the form of registers and a finite state machine (FSM) to schedule the test sequence using input from system monitor 33 and IP event monitor 34 described hereinbelow. With the system event monitor 32, the BIST controller 30 is configured to monitor system events and/or interconnect indicators (such as "power on," "power off," application triggers, clock status, etc.) and sensor inputs (e.g., voltage or temperature sensor input) and to send the system event information to the program scheduler 31 identifying when test opportunities are presented. In addition, the BIST controller 30 may include one or more analog IP event monitors 33 to monitor the status of an analog IP component under test for purposes of detecting or predicting idle states and sending idle status signal to the program scheduler 31. Finally, the BIST controller 30 may include a MUX controller 34 which generates MUX control signals to configure the multiplexer circuits (e.g., 20, 22, 24) to switch the DAC and ADC components between normal operation and BIST operation as described herein.

Figure 4:
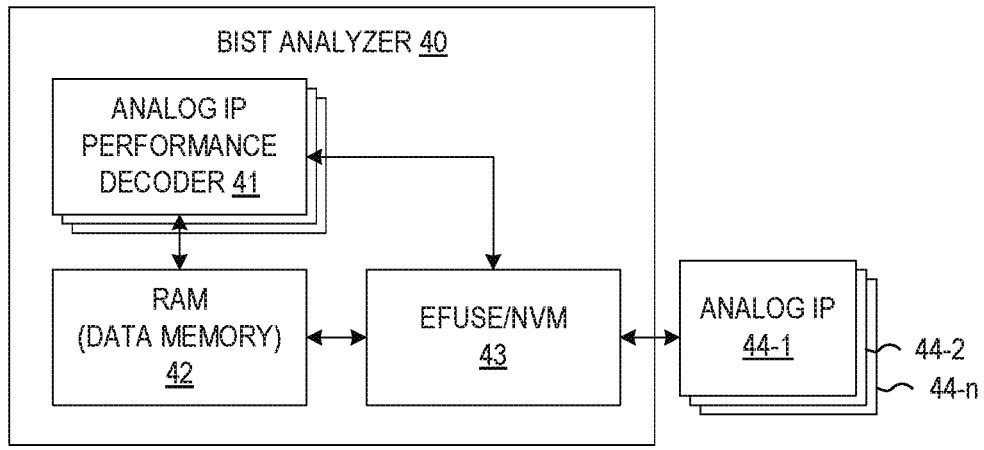
FIG. 4 depicts a simplified block diagram of a BIST analyzer in accordance with selected hardware embodiments of the present disclosure.

To provide additional details for an improved understanding of selected embodiments of the present disclosure, reference is now made to FIG. 4 which depicts a simplified block diagram of a hardware-based BIST analyzer 40 which is connected to analyze the analog test results received from the analog IP component(s) 44 under test. When implemented with dedicated hardware circuitry, the BIST analyzer 40 does not require a CPU and program memory to store software, but may instead be implemented as application-specific circuit which is designed to quickly and efficiently analyze the BIST results, but at the cost of having reduced flexibility. In such embodiments, the BIST analyzer 40 may include one or more analog IP performance decoders 41 which apply hardened pass/fail criteria using a dedicated algorithm to decode the performance of each analog IP component (e.g., 44-1, 44-2, ... 44-n) under test. In support of the performance decoding operations, the BIST analyzer 40 may also include a data memory RAM 42 (e.g., RAM) which is used to hold test results from the analog IP component under test 44 along with any intermediate data required during calculation by the performance decoder 41. In addition, the BIST analyzer 40 may include non-volatile or eFuse memory 43 which stores trim values and/or calibration coefficients generated by the analog IP performance decoder 41 to trim or calibrate the analog IP component under test 44.

Figure 5:
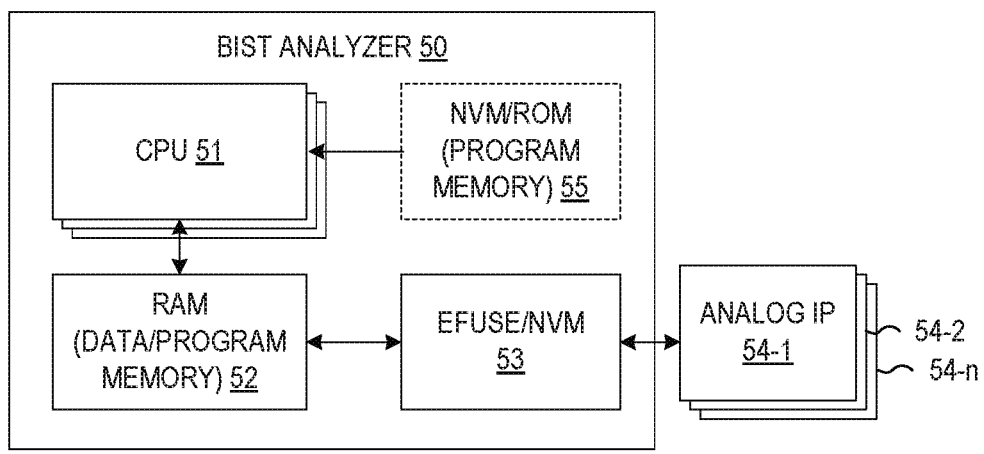
FIG. 5 depicts a simplified block diagram of a BIST analyzer in accordance with selected software embodiments of the present disclosure.

In other embodiments, the BIST analyzer functionality may be embodied with software as illustrated in FIG. 5. As depicted, the BIST analyzer 50 is connected to analyze the analog test results received from each analog IP component (e.g., 54-1, 54-2, . . . 54-*n*) under test, but instead of using hardware to decode the analog IP performance, the BIST analyzer 50 includes one or more CPUs 51 to provide versatile performance decoder functionality. The performance decoding software program may be stored in non-volatile memory (NVM) or Read-only memory (ROM) 55 for execution by the CPU 51. In addition or in the alternative, the BIST analyzer 50 may store the performance decoding software program in RAM 52. The RAM 52 may also store data memory for holding test results from the analog IP component under test 54 along with any intermediate data required by the CPU 51 during execution of performance decoding instructions. In addition, the BIST analyzer 50 may include non-volatile or eFuse memory 53 which stores trim values and/or calibration coefficients generated by the CPU 51 to trim or calibrate the analog IP component under test 54.

Figure 6:
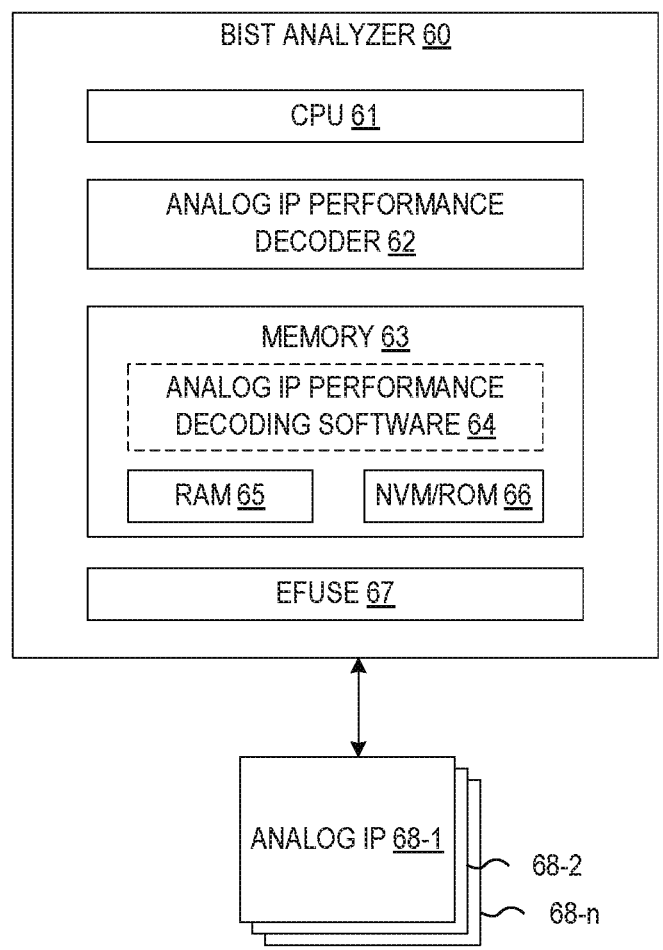
FIG. 6 depicts a simplified block diagram of a BIST analyzer in accordance with selected hybrid hardware/software embodiments of the present disclosure.

In yet other embodiments, the BIST analyzer functionality may be embodied with a mixture of hardware and software as illustrated in FIG. 6 which depicts a simplified block diagram of a BIST analyzer 60 in accordance with selected hybrid hardware/software embodiments of the present disclosure. As depicted, the BIST analyzer 60 is connected to analyze the analog test results received from each analog IP component (e.g., 68-1, 68-2, . . . 68-*n*) under test by using a combination of one or more CPUs 61 and analog IP performance decoders 62 to provide versatile performance decoder functionality. For example, the CPU 61 can provide a flexible option to support various performance decoding operations in software form, while the analog IP performance decoder 62 provides dedicated circuit processing of pass/fail criteria and other dedicated BIST algorithms to decode the performance of each analog IP component under test. In support of the performance decoding operations, the BIST analyzer 60 may also include a memory 63 which is used to store any performance decoding software program instructions 64 that is executed by the CPU 61. In addition, the memory 63 may include RAM 65 which holds test results from the analog IP component under test 68 along with any intermediate data required during calculation by the BIST analyzer 60. In addition, the memory 63 may include non-volatile memory (NVM) or read only memory (ROM) 66 which stores any performance decoding software program firmware used for lifetime testing along with trim values and/or calibration coefficients generated by the CPU 61 or analog IP performance decoder 62 to trim or calibrate the analog IP component under test 68. Finally, the BIST analyzer 60 may include eFuse memory 67 which stores trim values and/or calibration coefficients for the analog IP component under test 68.

Figure 7:
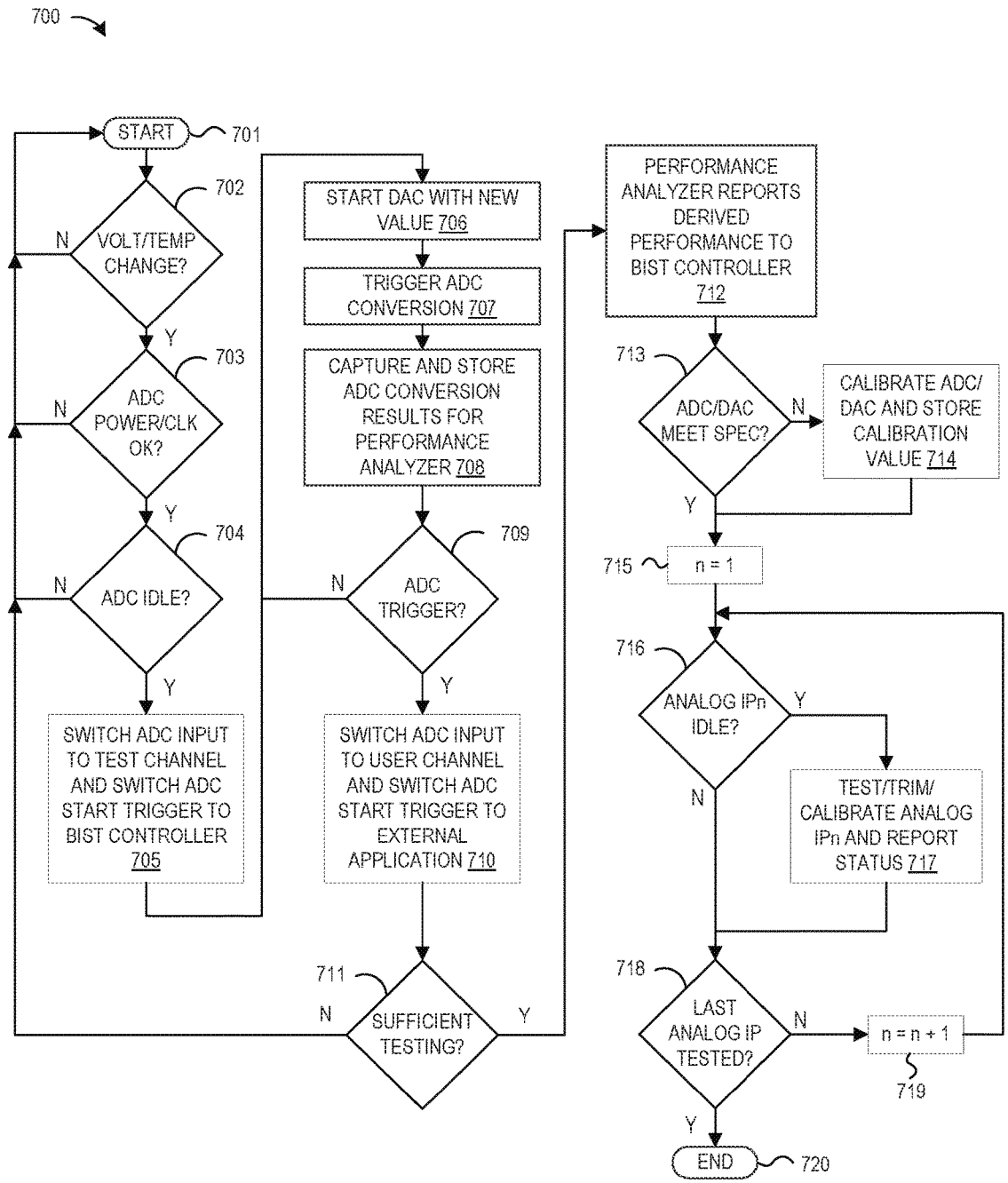
FIG. 7 illustrates simplified flow chart showing the logic for testing, trimming and calibrating an analog block in accordance with selected embodiments of the present disclosure.

To provide additional details for an improved understanding of selected embodiments of the present disclosure, reference is now made to FIG. 7 which depicts a simplified flow chart 700 showing the logic for non-intrusively testing, trimming and calibrating an analog block with an on-chip analog BIST tester in accordance selected embodiments of the present disclosure. In an example embodiment, the control logic and methodology shown in FIG. 7 may be implemented as hardware and/or software on a host computing system, processor, or microcontroller unit that includes processor and memory for storing programming control code for performing non-intrusive on-chip analog BIST testing by pausing or interrupting and resuming the BIST testing between individual idle states which have an idle time that is unknown, for whatever reason, or is known to be too short to perform the BIST testing. In other words, if the test time needed to completely conduct BIST testing of an analog component will exceed the available idle time from individual idle states in the required analog testing components, then the flow chart 700 illustrates a sequence for applying BIST testing of the performance of the DAC and ADC components over a plurality of idle states until sufficient testing data is captured for the DAC and ADC components, followed by sequential execution of test, trim, and/or calibration operations at one or more analog blocks during the idle state(s) for each such analog block. As such, any request from the normal application during the idle period to bring a required analog component (e.g., DAC, ADC, or analog block) back online may be handled by having the BIST controller instruct the required analog component to pause the BIST testing to allow for normal operation of the required analog component. Upon completion, the BIST controller may then instruct the required analog component to resume the BIST testing of the required analog component at the next idle state thereof.

Exemplary embodiments may prepare for BIST testing of one or more analog IP blocks on the SoC by first evaluating the DAC and/or ADC on a BIST testing subsystem. To this end, the BIST controller may provide input digital test signals to the DAC which has an analog output voltage solely dependent on digital control words provided with the input digital test signal. In turn, the DAC output is provided as an analog test signal directly to the ADC where it is converted back to digital form for analysis and feedback to the BIST performance analyzer for analysis of the ADC. To avoid conflicts with normal operations of the DAC and ADC, the BIST performance analyzer and/or controller may store raw or processed test data that is selectively provided to the DAC between normal conversion operations of the DAC and ADC. Once the performance of the DAC and ADC is confirmed or adjusted as needed by collecting a sufficient testing over the idle state(s), input digital test signals are converted into analog test signals by the DAC and then routed over a first bus for input to one or more analog IP blocks, the resulting output from the analog IP block(s) is then routed back over a second bus to the ADC where it is converted back to digital form for analysis and feedback to the BIST performance analyzer.

In FIG. 7, the method starts or restarts at step 701. At decision step 702, the BIST testing subsystem controller determines if there has been a voltage or temperature change, such as by accessing the system voltage and temperature sensors. If so, the flow proceeds to decision step 703, otherwise flow returns to step 701. At decision step 703, the BIST controller determines if the ADC and/or DAC are powered on and if the clock used by the ADC and/or DAC is operational. If so, the flow proceeds to decision step 704, otherwise flow returns to step 701. At decision step 704, the BIST controller determines whether the ADC (and/or DAC) is in an idle state or about to enter an idle state. In selected embodiments, the BIST controller may detect idle states by listening to the ADC and/or DAC to find idle cycles. When an idle cycle is detected, the flow proceeds to step 705, otherwise the flow proceeds to step 701.

At step 705, the BIST controller can assert control over the ADC (e.g., 23) and switch an ADC input channel to receive an analog input from the DAC (e.g., 24) via a test channel (e.g., 21C). At step 706, the BIST controller starts the DAC (e.g., 24) with a new digital input test signal value, such as by initiating a counter or random number generator to an initial value that is provided to DAC along with appropriate control signals. Once the DAC generates a corresponding analog signal, the analog signal is provided as an analog input test signal to the ADC (e.g., 23) via the test channel, and at step 707, the BIST controller provides appropriate BIST trigger signals to trigger ADC conversion at the ADC for converting the analog input test signal back into a digital signal. At step 708, the converted digital signal is captured and stored by the performance analyzer (e.g., 25). At step 709, the BIST controller determines whether the ADC (and/or DAC) is needed by the application, such as by detecting whether an ADC trigger request is received from the application. If not, the flow returns to step 706 to iteratively repeat the sequence of steps 706-709 for collecting additional test points for evaluating the ADC. But if the ADC is triggered by the application, the flow proceeds to step 710 where the ADC (e.g., 23) is switched back to normal application mode, allowing an analog signal from the application to be processed. Next, at step 711, the BIST controller determines whether a sufficient number of test points have been captured by the performance analyzer to analyze operation of the ADC (e.g., 23). If not, the flow returns to step 701, but if sufficient testing of the ADC has been performed, the flow proceeds to step 712.

At step 712, the captured digital values are analyzed by the performance analyzer (e.g., 25), which then derives a performance report (e.g., a performance matrix) which is reported to the BIST controller (e.g., 26) based upon the captured results. At step 713, the BIST controller determines if the performance of the ADC (and DAC) meet the performance specification requirements. This may be accomplished by comparing the performance matrix from the performance analyzer to predetermined performance criteria to determine whether the ADC (and DAC) is operating normally, or not normally. If it is determined at step 713 that the ADC and DAC are operating normally, the flow proceeds to step 715 where a test counter value "n" is initialized. However, if it is determined at step 713 that the ADC and DAC are not operating normally, the flow proceeds to step 714 where required adjustments are made to recalibrate the ADC and/or DAC by storing new calibration values, and then the flow proceeds to the test counter initialization step 715.

Using the test counter value n, the flow then iteratively tests one or more analog IP blocks (IP-1 . . . IP-n) by first detecting whether a first analog IP block "n" is idle. If the nth analog IP block is not idle, then the flow detects whether the last analog IP block has been tested at step 718. However, if it is determined at step 716 that the nth analog IP block is idle, then the BIST controller executes a test, trim and/or calibration process and reports the status results at step 717 before proceeding to step 718. If the last analog IP block has not been tested, then the flow proceeds to step 719 where a test counter value "n" is incremented (e.g., n=n+1), and the flow returns to step 716 to iteratively repeat the sequence of steps 716-718 for testing additional analog IP blocks. However, once it is determined at step 718 that the last analog IP block has been tested, then the flow proceeds to step 720 where the process ends.

As seen from the flow sequence 701-720 for non-intrusively testing, trimming and calibrating an analog block with an on-chip analog BIST tester, setup conditions are performed at steps 702-705 to detect voltage or temperature changes and readiness of the ADC, and then the DAC generates test signals to be sampled by the ADC during one or more idle states at steps 705-708. Once there is a request by the application to use the ADC for normal processing (step 709), the BIST controller relinquishes control of the ADC to the application and switches the ADC input channel to a user channel as soon as possible (step 710) and determines if the minimum amount of ADC conversion data test points have been acquired (step 711). If so, they are sent to the performance analyzer to derive a performance measure for the ADC or DAC (step 712). If the ADC performance specs are met (step 713) or if the ADC/DAC are calibrated to meet the performance specs (step 714), the analog IP blocks 1-$n$ are sequentially processed during available idle states to test, trim, and/or calibrate the analog IP blocks and file report status updates to the BIST controller (steps 716-717). As will be appreciated, the information received over the user channel may be received from a source that is not integrated onto the same semiconductor substrates as the built-in self-test circuitry, while the information received from the built-in self-test signal generator is integrated onto a common semiconductor substrate as the analog-to-digital converter. In addition, the information sent over the force and sense buses may be exchanged with analog IP blocks that are not integrated onto the same semiconductor substrates as the built-in self-test circuitry. In an embodiment, the current state of the built-in self-test is saved, and resumed during a next available idle time for a required analog component. In another embodiment, the current test information is not saved, and the built-in self-test will need to be restarted. The switching back to normal application operation might incur some delay between the initiation of ADC conversion from application and when the data is available for application. However, this delay will be considered as ADC latency when ADC being woke up from test mode.

By now it should be appreciated that there has been provided an apparatus, method, program code, and system for non-intrusively testing, calibrating, and/or trimming one or more SoC analog circuit blocks on demand. In the disclosed embodiments, the system includes a voltage and/or temperature sensor, a built-in self-test (BIST) controller, and one or more analog or mixed signal circuit blocks, such as a power management control circuit, a voltage regulator circuit, an oscillator circuit, a clock circuit, a phase lock loop circuit, a bandgap voltage reference generator circuit, analog-to-digital converter circuit, or a digital-to-analog converter circuit. Using one or more sensors, the BIST controller senses a voltage and/or temperature measure at one or more predetermined system-on-chip (SoC) locations. In addition, the BIST controller detects one or more idle states for a first analog circuit block during normal operation. Subsequently, a first built-in self-test of the first analog circuit block is initiated during the one or more idle states by sending one or more input test signals over a first bus to the first analog circuit block. In selected embodiments, the first built-in self-test of the first analog circuit block is initiated during the one or more idle states by sending one or more digital input test signals to a digital-to-analog converter (DAC) and routing one or more analog input test signals from the DAC over the first bus to the first analog circuit block. In such embodiments, the DAC may be initiated or set-up prior to initiating the built-in self-test of the first analog circuit block by determining one or more idle states of the DAC during normal operation; initiating a built-in self-test of the DAC during the one or more third idle states; providing a digital built-in self-test signal to the DAC during the one or more idle states in response to initiating the built-in self-test; and analyzing a test result produced by the DAC from the digital built-in self-test signal to determine if the DAC passed the built-in self-test based on the test result matching an expected test result. In addition, one or more built-in self-test results from the first analog circuit block are provided over a second bus from during the one or more idle states. In selected embodiments, the built-in self-test results are provided by receiving one or more analog test signals received over the second bus from the first analog circuit block at an analog-to-digital converter (ADC) during the one or more idle states which generates digital built-in self-test results for the first analog circuit block. In selected embodiments, the ADC may be initiated or set-up prior to initiating the built-in self-test of the first analog circuit block, by determining one or more idle states of the ADC during normal operation; initiating a built-in self-test of the ADC during the one or more idle states; providing an analog built-in self-test signal to the ADC during the one or more idle states in response to initiating the built-in self-test; and analyzing a test result produced by the ADC from the analog built-in self-test signal to determine if the ADC passed the built-in self-test based on the test result matching an expected test result. At the BIST controller, the digital built-in self-test results are analyzed in combination with any voltage and/or temperature measure to evaluate selected performance measures for the first analog circuit block against one or more performance criteria. In such embodiments, the ADC may be calibrated if analyzing the test result determines that the ADC does not pass the second built-in self-test. In selected embodiments, the first built-in self-test is initiated by issuing one or more multiplexer control signals to one or more multiplexer circuits to switch an input of the ADC from an output of the DAC during normal operation to the second bus during the one or more idle states.

In another embodiment, there is provided an integrated circuit device having an analog circuit block, a voltage monitor, a temperature sensor, a built-in self-test (BIST) controller, and a BIST analyzer, all of which may be embodied as a system-on-chip. The disclosed analog circuit block may be selected from a group consisting of a power management control circuit, a voltage regulator circuit, an oscillator circuit, a clock circuit, a phase lock loop circuit, a bandgap voltage reference generator circuit, analog-to-digital converter circuit, or a digital-to-analog converter circuit. The voltage monitor is operative to measure a voltage on the integrated circuit device, and the temperature sensor is operative to measure a temperature on the integrated circuit device. The built-in self-test (BIST) controller is connected to the voltage monitor and temperature sensor and is configured to control a built-in self-test of the analog circuit block in response to detecting one or more idle states at the analog circuit block by routing one or more analog input test signals over a first bus to the analog circuit block and routing one or more built-in self-test results from the analog circuit block over a second bus during the one or more idle states. The BIST analyzer is operably coupled to receive and analyze the one or more built-in self-test results from the analog circuit block in combination with any voltage and/or temperature measure to evaluate selected performance measures for the analog circuit block against one or more performance criteria. The integrated circuit device may also include a digital-to-analog converter (DAC) which is operably coupled to receive one or more digital input test signals from the BIST controller and to produce one or more analog input test signals for routing over the first bus to the analog circuit block. The integrated circuit device may also include an analog-to-digital converter (ADC) which is operably coupled to receive one or more analog output test signals over the second bus from the analog circuit block and to produce one or more digital built-in self-test results for routing to the BIST analyzer.

In yet another form, there is provided a non-intrusive mixed-signal test system formed on a single integrated circuit which includes a mixed-signal subsystem, a BIST controller, and a BIST analyzer. The disclosed BIST controller is connected to monitor one or more voltages and/or temperatures on the single integrated circuit and is also configured to control a built-in self-test of the mixed-signal subsystem in response to detecting one or more idle states at the mixed-signal subsystem by routing one or more analog input test signals over a first bus to the mixed-signal subsystem and routing one or more built-in self-test results from the mixed-signal subsystem over a second bus during the one or more idle states. The BIST analyzer is operably coupled to receive and analyze the one or more built-in self-test results from the mixed-signal subsystem in combination with any voltage and/or temperature measure to evaluate selected performance measures for the mixed-signal subsystem against one or more performance criteria. In selected embodiments, the system also includes a digital-to-analog converter (DAC) which is operably coupled to receive one or more digital input test signals from the BIST controller and to produce one or more analog input test signals for routing over the first bus to the mixed-signal subsystem. In addition, the system may include analog-to-digital converter (ADC) which is operably coupled to receive the one or more built-in self-test results as one or more analog output test signals over the second bus from the mixed-signal subsystem and to produce one or more digital built-in self-test results for routing to the BIST analyze. In such embodiments, the built-in self-test controller may be configured to issue one or more multiplexer control signals to one or more multiplexer circuits to switch an input of the ADC from an output of the DAC during normal operation to the second bus during the one or more idle states.

Although the described exemplary embodiments disclosed herein are directed to methods and systems for non-intrusively testing, trimming and calibrating analog blocks with reference to an on-chip analog BIST tester, the present invention is not necessarily limited to the example embodiments illustrate herein, and various embodiments of the circuitry and methods disclosed herein may be implemented with other devices and circuit components. For example, various embodiments may be implemented to increase the testing visibility of analog blocks, to reduce the need for expensive mixed-signal test equipment, to improve PVT compensation in trimming and calibration by providing time and voltage sensor inputs, and to eliminate the need for test engineer expertise by providing an on-chip analog test, trim, and/or calibration subsystem with easy access to analog blocks to support lifetime test, trim, and calibration while being non-intrusive to normal system operation. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method, comprising:
   sensing a voltage and/or temperature measure at one or more predetermined system-on-chip (SoC) locations;
   detecting one or more idle states for a first analog circuit block during normal operation;
   initiating a first built-in self-test of the first analog circuit block during the one or more idle states by sending one or more input test signals over a first bus to the first analog circuit block;
   receiving, at a built-in self-test subsystem, one or more built-in self-test results for the first analog circuit block over a second bus that is connected to the built-in self-test subsystem during the one or more idle states; and
   analyzing the built-in self-test results in combination with any voltage and/or temperature measure to evaluate selected performance measures for the first analog circuit block against one or more performance criteria.

2. The method of claim 1, wherein the first analog circuit block is selected from a group consisting of a power management control circuit, a voltage regulator circuit, an oscillator circuit, a clock circuit, a phase lock loop circuit, a bandgap voltage reference generator circuit, analog-to-digital converter circuit, or a digital-to-analog converter circuit.

3. The method of claim 1, wherein receiving one or more built-in self-test results comprises providing one or more analog test signals from the first analog circuit block to an analog-to-digital converter (ADC) during the one or more idle states to generate digital built-in self-test results for the first analog circuit block that are provided over the second bus to the built-in self-test subsystem.

4. The method of claim 3, further comprising:
   determining, before initiating the built-in self-test of the first analog circuit block, one or more second idle states of the ADC during normal operation;
   initiating a second built-in self-test of the ADC during the one or more second idle states;
   providing an analog built-in self-test signal to the ADC during the one or more second idle states in response to initiating the second built-in self-test; and
   analyzing a test result produced by the ADC from the analog built-in self-test signal to determine if the ADC passed the second built-in self-test based on the test result matching a first expected test result.

5. The method of claim 4, further comprising calibrating the ADC if analyzing the test result determines that the ADC does not pass the second built-in self-test.

6. The method of claim 1, wherein initiating the first built-in self-test comprises initiating the first built-in self-test of the first analog circuit block during the one or more idle states by sending one or more digital input test signals to a digital-to-analog converter (DAC) and routing one or more analog input test signals from the DAC over the first bus to the first analog circuit block.

7. The method of claim 6, further comprising:
   determining, before initiating the built-in self-test of the first analog circuit block, one or more third idle states of the DAC during normal operation;
   initiating a third built-in self-test of the DAC during the one or more third idle states;
   providing a digital built-in self-test signal to the DAC during the one or more third idle states in response to initiating the third built-in self-test; and
   analyzing a test result produced by the DAC from the digital built-in self-test signal to determine if the DAC passed the third built-in self-test based on the test result matching a second expected test result.

8. The method of claim 6, wherein receiving one or more built-in self-test results comprises providing one or more analog test signals from the first analog circuit block to an analog-to-digital converter (ADC) during the one or more idle states to generate digital built-in self-test results for the first analog circuit block that are provided over the second bus to the built-in self-test subsystem.

9. The method of claim 8, where initiating the first built-in self-test comprises issuing one or more multiplexer control signals to one or more multiplexer circuits to switch an input of the ADC from an output of the DAC during normal operation to the second bus during the one or more idle states.

10. The method of claim 1, where a built-in self-test controller senses the voltage and/or temperature measure and detects one or more idle states for the first analog circuit block.

11. An integrated circuit device, comprising:
   an analog circuit block;
   a voltage monitor for measuring a voltage on the integrated circuit device;
   a temperature sensor for measuring a temperature on the integrated circuit device;
   built-in self-test (BIST) controller connected to the voltage monitor and temperature sensor and configured to control a built-in self-test of the analog circuit block in response to detecting one or more idle states at the analog circuit block by routing one or more analog input test signals over a first bus to the analog circuit block and routing one or more built-in self-test results from the analog circuit block to a second bus during the one or more idle states; and a BIST analyzer operably coupled to the second bus to receive and analyze the one or more built-in self-test results from the analog circuit block in combination with any voltage and/or temperature measure to evaluate selected performance measures for the analog circuit block against one or more performance criteria.

12. The integrated circuit device of claim 11, where the integrated circuit comprises a system-on-chip.

13. The integrated circuit device of claim 11, where the analog circuit block is selected from a group consisting of a power management control circuit, a voltage regulator circuit, an oscillator circuit, a clock circuit, a phase lock loop circuit, a bandgap voltage reference generator circuit, analog-to-digital converter circuit, or a digital-to-analog converter circuit.

14. The integrated circuit device of claim 11, further comprising a digital-to-analog converter (DAC) which is operably coupled to receive one or more digital input test signals from the BIST controller and to produce one or more analog input test signals for routing over the first bus to the analog circuit block.

15. The integrated circuit device of claim 11, further comprising an analog-to-digital converter (ADC) which is operably coupled to receive one or more analog output test signals from the analog circuit block and to produce one or more digital built-in self-test results for routing to the BIST analyzer over the second bus.

16. A non-intrusive mixed-signal test system formed on a single integrated circuit, comprising:

a mixed-signal subsystem;

a built-in self-test (BIST) controller connected to monitor one or more voltages and/or temperatures on the single integrated circuit and configured to control a built-in self-test of the mixed-signal subsystem in response to detecting one or more idle states at the mixed-signal subsystem by routing one or more analog input test signals over a first bus to the mixed-signal subsystem and routing one or more built-in self-test results from the mixed-signal subsystem to a second bus during the one or more idle states; and a BIST analyzer operably coupled to the second bus to receive and analyze the one or more built-in self-test results from the mixed-signal subsystem in combination with any voltage and/or temperature measure to evaluate selected performance measures for the mixed-signal subsystem against one or more performance criteria.

17. The non-intrusive mixed-signal test system of claim 16, further comprising a digital-to-analog converter (DAC) which is operably coupled to receive one or more digital input test signals from the BIST controller and to produce one or more analog input test signals for routing over the first bus to the mixed-signal subsystem.

18. The non-intrusive mixed-signal test system of claim 17, further comprising an analog-to-digital converter (ADC) which is operably coupled to receive the one or more built-in self-test results as one or more analog output test signals from the mixed-signal subsystem and to produce one or more digital built-in self-test results for routing to the BIST analyzer over the second bus.

19. The non-intrusive mixed-signal test system of claim 17, wherein the mixed-signal subsystem is selected from a group consisting of a power management control circuit, a voltage regulator circuit, an oscillator circuit, a clock circuit, a phase lock loop circuit, a bandgap voltage reference generator circuit, analog-to-digital converter circuit, or a digital-to-analog converter circuit.

20. The non-intrusive mixed-signal test system of claim 19, where the built-in self-test controller is configured to issue one or more multiplexer control signals to one or more multiplexer circuits to switch an input of the ADC from an output of the DAC during normal operation to the second bus during the one or more idle states.

* * * * *